(12) United States Patent
Salazar et al.

(10) Patent No.: US 11,024,541 B2
(45) Date of Patent: Jun. 1, 2021

(54) PROCESS FOR MOLDING A BACK SIDE WAFER SINGULATION GUIDE

(71) Applicant: Qorvo US, Inc., Greensboro, NC (US)

(72) Inventors: Neftali Salazar, Oak Ridge, NC (US); Rommel Quintero, High Point, NC (US); Thomas Scott Morris, Lewisville, NC (US)

(73) Assignee: Qorvo US, Inc., Greensboro, NC (US)

( * ) Notice: Subject to any disclaimer, the term of this patent is extended or adjusted under 35 U.S.C. 154(b) by 23 days.

(21) Appl. No.: 16/449,885

(22) Filed: Jun. 24, 2019

(65) Prior Publication Data

US 2020/0111708 A1 Apr. 9, 2020

Related U.S. Application Data

(60) Provisional application No. 62/741,251, filed on Oct. 4, 2018.

(51) Int. Cl.
| | |
|---|---|
| *H01L 21/78* | (2006.01) |
| *H01L 21/683* | (2006.01) |
| *H01L 21/56* | (2006.01) |
| *H01L 23/00* | (2006.01) |
| *H01L 23/498* | (2006.01) |

(52) U.S. Cl.
CPC .......... *H01L 21/78* (2013.01); *H01L 21/561* (2013.01); *H01L 21/6836* (2013.01); *H01L 23/49816* (2013.01); *H01L 24/09* (2013.01); *H01L 24/14* (2013.01); *H01L 24/29* (2013.01); *H01L 24/97* (2013.01); *H01L 2221/68327* (2013.01); *H01L 2224/04105* (2013.01); *H01L 2224/1601* (2013.01); *H01L 2924/14* (2013.01); *H01L 2924/15311* (2013.01)

(58) Field of Classification Search
CPC ........................................................ H01L 21/78
USPC ........................................................ 438/460
See application file for complete search history.

(56) References Cited

U.S. PATENT DOCUMENTS

| | | | |
|---|---|---|---|
| 10,771,024 B2 * | 9/2020 | Zampardi, Jr. ..... | H01L 21/8252 |
| 2014/0002188 A1 * | 1/2014 | Chen .................. | H01L 29/0821 |
| | | | 330/250 |
| 2015/0187608 A1 * | 7/2015 | Ganesan ................ | H01L 24/14 |
| | | | 257/738 |
| 2016/0276176 A1 * | 9/2016 | Kamphuis ........... | H01L 23/3164 |

(Continued)

*Primary Examiner* — Jami Valentine Miller
(74) *Attorney, Agent, or Firm* — Withrow & Terranova, P.L.L.C.

(57) ABSTRACT

A process for molding a back side wafer singulation guide is disclosed. Structures for heat mitigation include an overmold formed over a contact surface of a device layer of a wafer, covering bump structures. The overmold and bump structures are thinned and planarized, and the overmold provides an underfill to increase interconnect reliability of a semiconductor die in a flip chip bonded package. However, visibility of singulation guides on the contact surface is obstructed. A channel is formed extending through the device layer and into the handle layer, and is filled with the overmold. The handle layer is replaced with a thermally-conductive molding layer formed on the back side for dissipating heat generated by semiconductor devices. The thermally-conductive handle is thinned until the overmold in the channel beneath the device layer is exposed. The exposed overmold provides a visible back side singulation guide for singulating the wafer.

20 Claims, 5 Drawing Sheets

(56) References Cited

U.S. PATENT DOCUMENTS

2017/0012031 A1* 1/2017 Lim .................. H01L 21/565
2018/0254259 A1* 9/2018 Grivna .................. H01L 24/05

* cited by examiner

PROCESS FOR MOLDING A BACK SIDE WAFER SINGULATION GUIDE

RELATED APPLICATION

This application claims the benefit of U.S. Provisional Patent Application Ser. No. 62/741,251, filed Oct. 4, 2018, which is incorporated herein by reference in its entirety.

FIELD OF THE DISCLOSURE

The present disclosure relates generally to wafer processing and, more particularly, to a process for singulating a wafer into semiconductor dies that each include a heat mitigation feature.

BACKGROUND

Market trends in consumer products motivate developers of integrated circuit technology to provide semiconductor dies of decreasing size but increasing functionality. Achieving these conflicting objectives requires transistor density in a semiconductor die to increase. As transistor density increases, so does an amount of potentially destructive heat generated by the transistors within a semiconductor die. Various methods and features have been developed for mitigating heat-related problems in semiconductor die. Heat mitigation features may be implemented in the packaging of the semiconductor die in a semiconductor device, while other heat mitigation features are incorporated into the semiconductor dies themselves as part of a semiconductor wafer during wafer level processing. The wafer level methods may reduce manufacturing time and cost compared to packaging methods, but may cause the process of wafer singulation to become more difficult.

SUMMARY

A process for molding a back side wafer singulation guide is disclosed. Heat mitigation structures may be implemented on a wafer that will be divided into a plurality of semiconductor dies, with each semiconductor die including a handle layer and a device layer. The device layer is a thin layer supported by the handle layer. The device layer of each semiconductor die includes a semiconductor device, and the wafer includes a contact surface electrically coupled to the semiconductor devices. Bump structures are formed on the contact surface of the wafer so the semiconductor devices can be interconnected to an external circuit during packaging. In a first aspect, the structures for heat mitigation include an overmold formed over the contact surface of the device layer of the wafer and covering the bump structures. The overmold and bump structures are thinned and planarized, and the overmold provides an underfill to increase interconnect reliability of a semiconductor die in a flip chip bonded package. Visibility of singulation guides on the contact surface of the wafer may be obstructed by the overmold so a back side wafer singulation guide is formed. In this regard, along streets in the contact surface of the device layer, a channel is formed extending through the device layer and into the handle layer of the wafer. As the overmold is disposed over the contact surface, the channel is filled with the overmold. In a second aspect, with the overmold in place to provide support for the device layer, the handle layer on the back side of the wafer is removed and replaced with a thermally-conductive molding layer for dissipating heat generated by the semiconductor devices in the device layer. The thermally-conductive molding layer is planarized and thinned until the overmold in the channel beneath the device layer is exposed. The exposed overmold provides a visible back side singulation guide for singulating the wafer.

In another aspect, a method of forming a back side wafer singulation guide is disclosed. The method includes forming a plurality of bump structures on a contact surface of a device layer of a substrate and forming a channel in the contact surface extending through the device layer into substrate material of the substrate. The method includes disposing an overmold on the contact surface and into the channel, the overmold disposed in the channel forming an overmold rib, and removing the substrate material from a back side of the substrate to expose the overmold rib. The method includes forming an encapsulating layer on the back side of the substrate and over the overmold rib, thinning the encapsulating layer on the back side of the substrate to expose a surface of the overmold rib, and singulating the substrate by cutting along the surface of the overmold rib.

In another aspect, a semiconductor die is disclosed. The semiconductor die includes a device layer comprising a semiconductor device and a contact surface, a thermally-conductive encapsulating layer on a back side of the device layer opposite to the contact surface, and a bonding layer disposed on the contact surface. The bonding layer comprises bump structures each electrically coupled to the semiconductor device, an overmold disposed on the contact surface around the bump structures, and a planar surface including each of the bump structures and the overmold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A process for molding a back side wafer singulation guide is disclosed. Heat mitigation structures may be implemented on a wafer that will be divided into a plurality of semiconductor dies, with each semiconductor die including a handle layer and a device layer. The device layer is a thin layer supported by the handle layer. The device layer of each semiconductor die includes a semiconductor device, and the wafer includes a contact surface electrically coupled to the semiconductor devices. Bump structures are formed on the contact surface of the wafer so the semiconductor devices can be interconnected to an external circuit during packaging. In a first aspect, the structures for heat mitigation include an overmold formed over the contact surface of the device layer of the wafer and covering the bump structures. The overmold and bump structures are thinned and planarized, and the overmold provides an underfill to increase interconnect reliability of a semiconductor die in a flip chip bonded package. Visibility of singulation guides on the contact surface of the wafer may be obstructed by the overmold so a back side wafer singulation guide is formed. In this regard, along streets in the contact surface of the device layer, a channel is formed extending through the device layer and into the handle layer of the wafer. As the overmold is disposed over the contact surface, the channel is filled with the overmold. In a second aspect, with the overmold in place to provide support for the device layer, the handle layer on the back side of the wafer is removed and replaced with a thermally conductive molding layer for dissipating heat generated by the semiconductor devices in the device layer. The thermally conductive molding layer is planarized and thinned until the overmold in the channel beneath the device layer is exposed. The exposed overmold provides a visible back side singulation guide for singulating the wafer.

Figure 1:
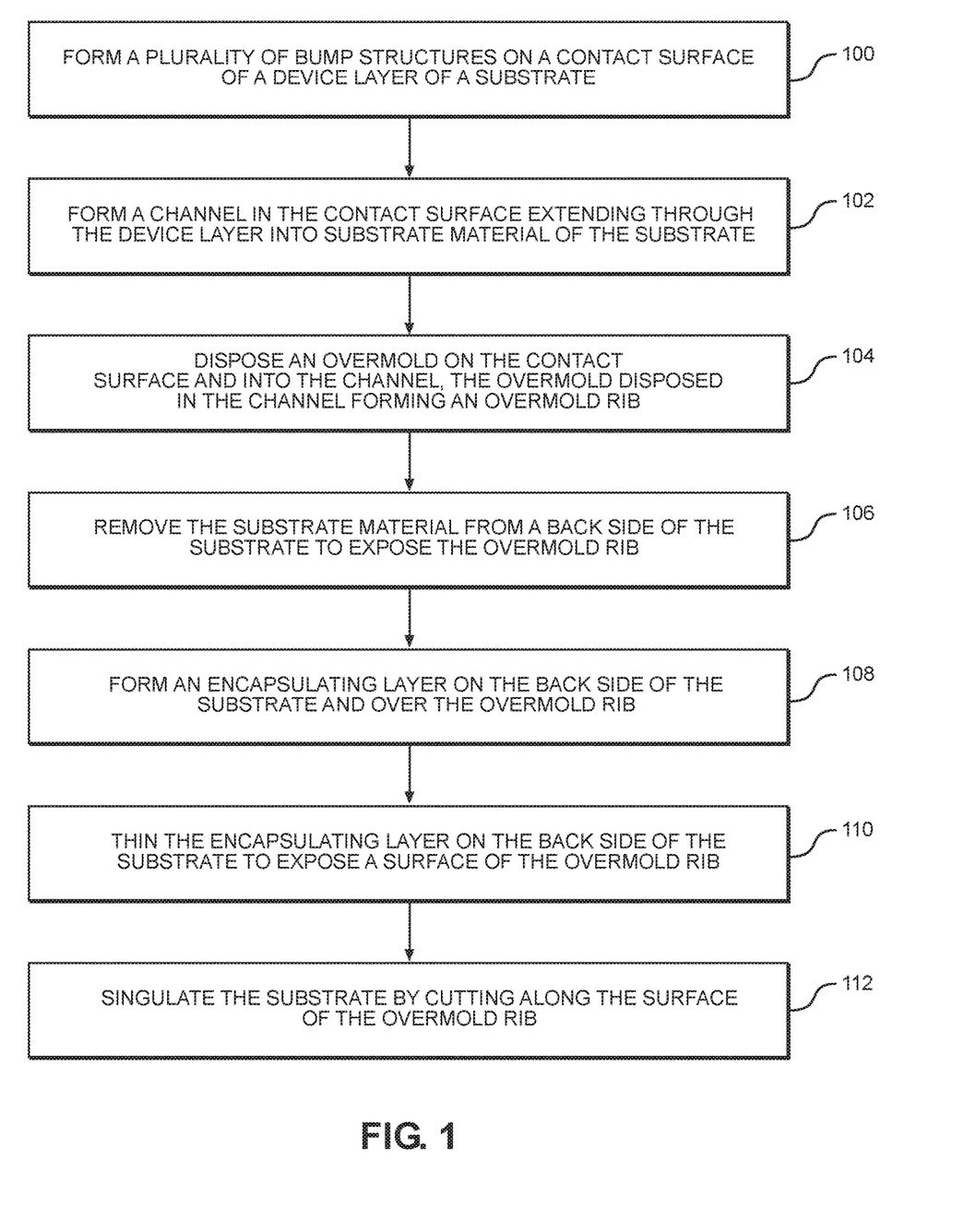
FIG. 1 is a flow diagram of disposing an overmold into a channel on a bumped contact surface of a substrate onto which a thermally-conductive back side molding is formed to form a singulation guide comprising the overmold on the back side of the substrate, according to fabrication stages illustrated in FIGS. 2-8B.

FIG. 1 is a flow diagram of an exemplary process for disposing an overmold into a channel on a bumped contact surface of a substrate onto which a thermally-conductive back side molding is formed to form a singulation guide comprising the overmold on the back side of the substrate, according to fabrication stages illustrated in FIGS. 2-8B.

Figure 2:
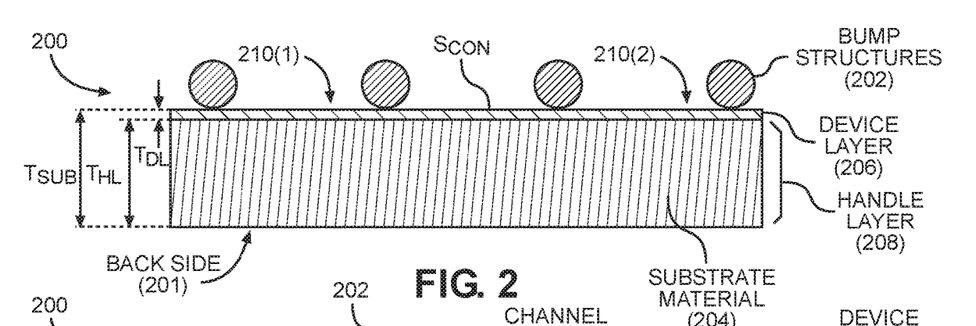
FIG. 2 is cross-sectional side view of a substrate in which bump structures are formed on the contact surface of the substrate.

FIG. 2 is cross-sectional side view of a substrate 200 in the process in FIG. 1 in which a plurality of bump structures 202 are formed on the contact surface $S_{CON}$ of the substrate 200. FIGS. 2-8B may illustrate a portion of a larger substrate 200. The contact surface $S_{CON}$ provides access to a device layer 206 in the substrate 200. The substrate 200 further comprises a handle layer 208 formed of a substrate material 204 on a back side 201 of the substrate 200 opposite to the contact surface $S_{CON}$. The handle layer 208 may provide structural support for the device layer 206 during manufacturing processes. Silicon is one non-limiting example of the substrate material 204 for forming the handle layer 208. Alternatively, the handle layer 208 may include multiple layers (not shown). In one example, the handle layer 208 could include a Si base substrate, an insulator layer, and a thin Si top layer beneath the device layer 206. The device layer 206 of the substrate 200 includes a plurality of devices 210(x), including first and second devices 210(1) and 210 (2). The process of FIG. 1 includes forming the plurality of bump structures 202 on the contact surface $S_{CON}$ of the device layer 206 of the substrate 200 (block 100, FIG. 1). In this regard, the bump structures 202 may be formed on contacts (not shown) electrically coupled to the devices 210(x) in the device layer 206. The bump structures 202, in the example, may be disposed in a ball grid array (BGA) of solder balls formed on the contacts for electrically coupling each device 210(x) to an external circuit on a board, module, or other external structure in a device package. The bump structures 202 may comprise solder balls formed of tin (Sn) and silver (Ag), pillars formed of copper (Cu), or gold (Au) stud bumps, for example. The devices 210(x) may be, for example, diodes, transistors, switches, filters, mechanical switches (e.g., micro-electro-mechanical (MEMS) switches), resonators, and the like formed during processing of the substrate 200. The substrate 200, in the example in FIG. 2, may have a total thickness $T_{SUB}$ of approximately 725 micrometers (μm), with the device layer 206 having a thickness $T_{DL}$ of less than 25 μm, and the handle layer 208 having a thickness $T_{HL}$ of approximately 700 μm. The substrate 200 may include an optional etch stop layer (e.g., a buried oxide (BOX) layer, or a silicon germanium (SiGe) interfacial layer) (not shown), separating the handle layer 208 from the device layer 206.

Incorporating heat mitigation features on the devices 210(x) during processing of the substrate 200 can reduce manufacturing costs and time compared to implementing heat mitigation features in individual semiconductor device packages. However, as noted above, implementing a heat mitigation feature on the contact surface $S_{CON}$ of the substrate 200 may obstruct visibility of streets between the devices 210(x) that are employed to guide a singulation process. As discussed below, the process in FIG. 1 includes formation of a back side wafer singulation guide to overcome problems with obstructed visibility of singulation guides on a wafer contact surface.

Figure 3A:
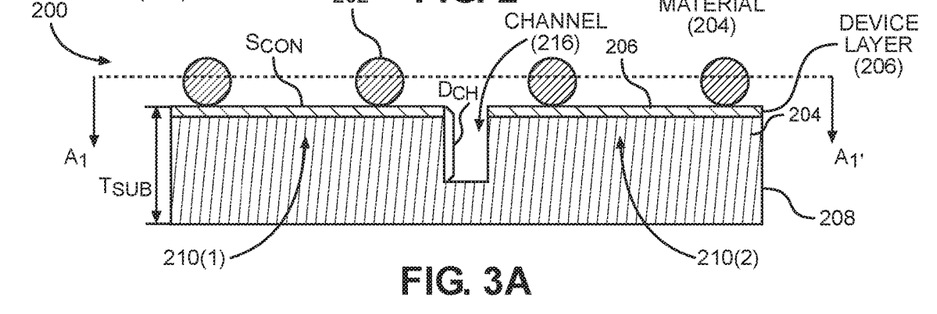
FIGS. 3A and 3B are a cross-sectional side view and a top view, respectively, of the substrate in FIG. 2 in which a channel is formed in the contact surface of the substrate.
Figure 3B:
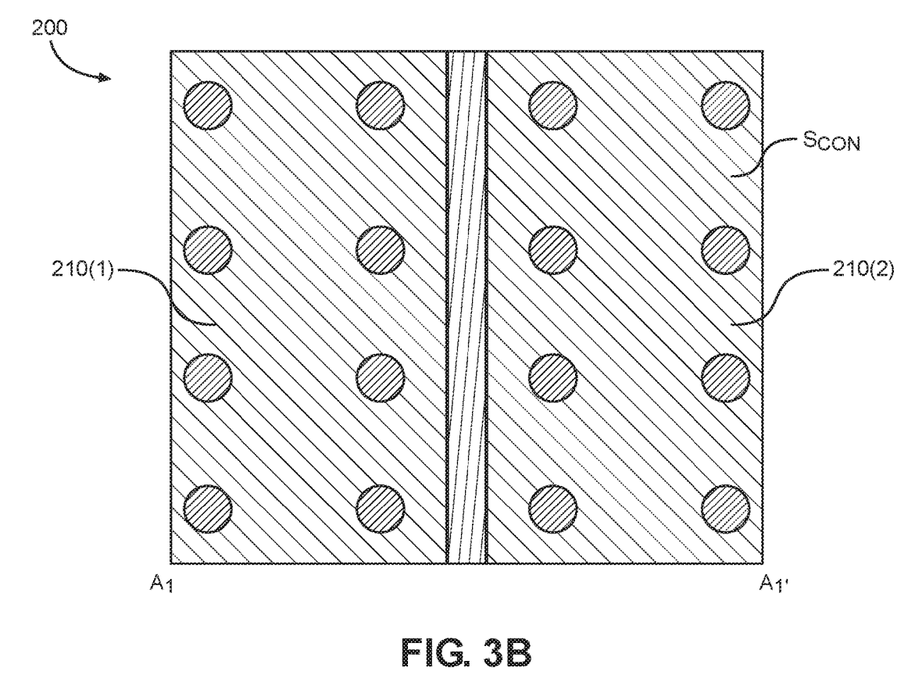

FIGS. 3A and 3B are a cross-sectional side view and a top view along line $A_1$-$A_1$' in FIG. 3A, respectively, of the substrate 200 in the process in FIG. 1, which includes forming a channel 216 between the first and second devices 210(1), 210(2) in the device layer 206 of the substrate 200. As shown in the cross-sectional view in FIG. 3A, the channel 216 extends through the device layer 206 into the substrate material 204 of the substrate 200 (block 102, FIG. 1), such that a depth $D_{CH}$ of the channel 216 may be approximately half (½) of the thickness $T_{SUB}$ of the substrate 200. The depth $D_{CH}$ of the channel 216 may be in the range of approximately 45% to approximately 55% of the thickness $T_{SUB}$ of the substrate 200. Thus, the channel depth $D_{CH}$ may be in the range of approximately 325 μm to approximately 400 μm. Forming the channel 216, in the example of FIG. 2, may include employing a singulation saw or other means known to persons skilled in the art to cut the channel 216 into the contact surface $S_{CON}$. A width of the channel 216 may be about 80 micrometers (μm), for example. FIG. 3B is a top view of the substrate 200 showing the bump structures 202 on the contact surface $S_{CON}$ and the channel 216 extending through the contact surface $S_{CON}$ and into the substrate material 204 of the handle layer 208 between devices 210(1) and 210(2).

Figure 4:
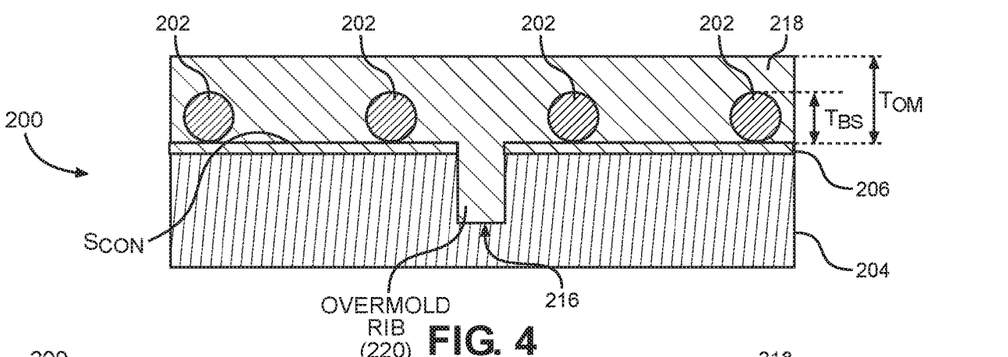
FIG. 4 is cross-sectional side view of the substrate in FIGS. 3A and 3B in the process in FIG. 1 in which an overmold is disposed on the contact surface and in the channel to form a singulation guide.

FIG. 4 is a cross-sectional side view of the substrate 200 in the process in FIG. 1, which includes disposing an overmold 218 on the contact surface $S_{CON}$ and into the channel 216. The overmold 218 disposed in the channel 216 forms an overmold rib 220 (block 104, FIG. 1). In this regard, the overmold 218 may extend approximately halfway through the thickness $T_{SUB}$ of the substrate 200, based on the depth $D_{CH}$ of the channel 216. Disposing the overmold 218 may further include disposing the overmold 218 to cover the plurality of bump structures 202 on the contact surface $S_{CON}$. In this regard, a thickness $T_{OM}$ of the overmold 218 above the contact surface $S_{CON}$, in the example in FIG. 4, is equal to or greater than a height $T_{BS}$ of the bump structures 202. The overmold 218 may be a molding compound disposed by a high-compression molding process, as known in the art. For example, the compression molding process utilizes a combination of heat, pressure, and vacuum to form a surface of an overmold 218 on the contact surface $S_{CON}$ of the substrate 200. The overmold 218 may be an injection molding grade polymer or thermally-conductive plastic. The overmold 218 may be formed of a high-temperature material or low-temperature material such as a thermo-set material, for example, having characteristics beneficial for use in an underfill in a flip chip bonded package.

Figure 5A:
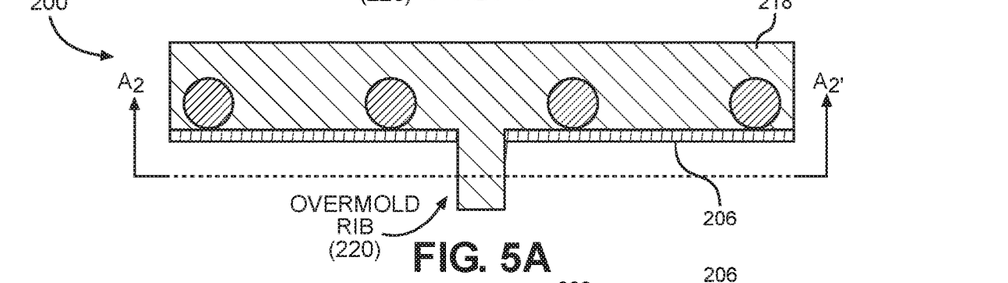
FIGS. 5A and 5B are a cross-sectional side view and a bottom view, respectively, of the substrate in FIG. 4 in the process in FIG. 1 in which a handle layer is removed from a back side of the substrate.
Figure 5B:
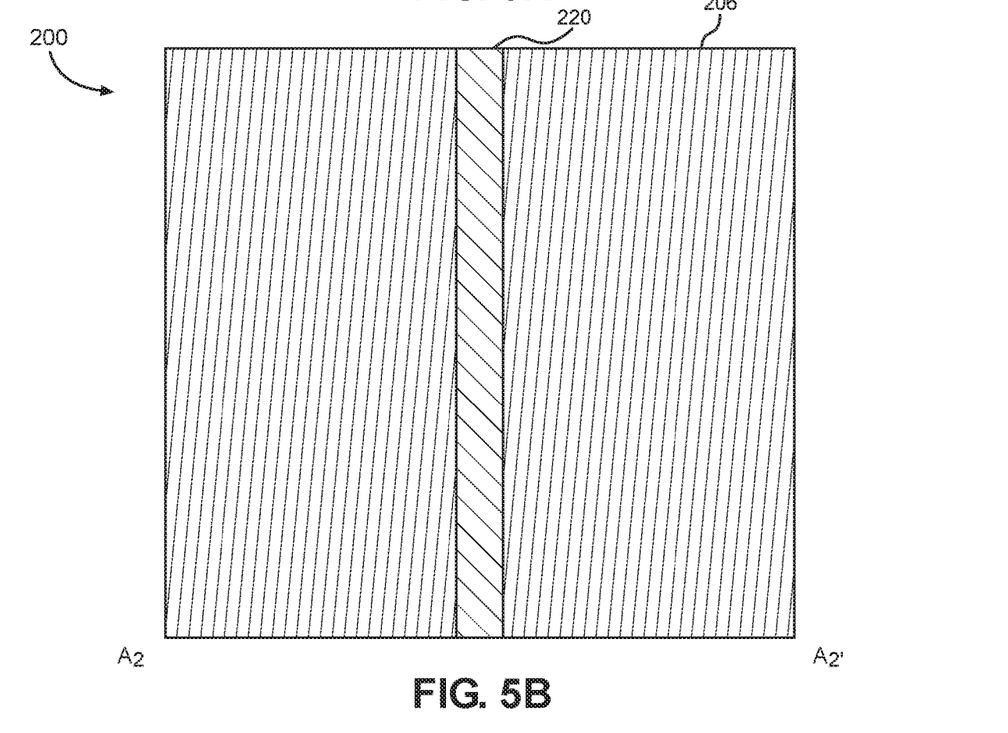

FIGS. 5A and 5B are a cross-sectional side view and a bottom view along line $A_2$-$A_2$' in FIG. 5A, respectively, of the substrate 200 in the process in FIG. 1, which includes removing the substrate material 204 from the back side 201 of the substrate 200, which exposes the overmold rib 220 (block 106, FIG. 1). Thus, the substrate material 204 of the handle layer 208 is removed without removing the overmold 218. The substrate material 204 may be removed by a selective etching process having a duration determined by a thickness $T_{HL}$ of the handle layer 208 and an etching rate of the substrate material 204, for example. Alternatively, the etching process for removing the handle layer 208 may be limited by the optional etch stop layer (not shown), which is not removed by the etching process. As shown in FIG. 5A, the substrate material 204 of the handle layer 208 is removed, leaving the overmold 218 to support the device layer 206. FIG. 5A also shows the overmold rib 220, which was formed of overmold 218 disposed in the channel 216, extending through the device layer 206. FIG. 5B is a bottom view showing the back side 201 of the substrate 200 with the handle layer 208 removed, and the overmold rib 220 extending through the device layer 206.

Figure 6:
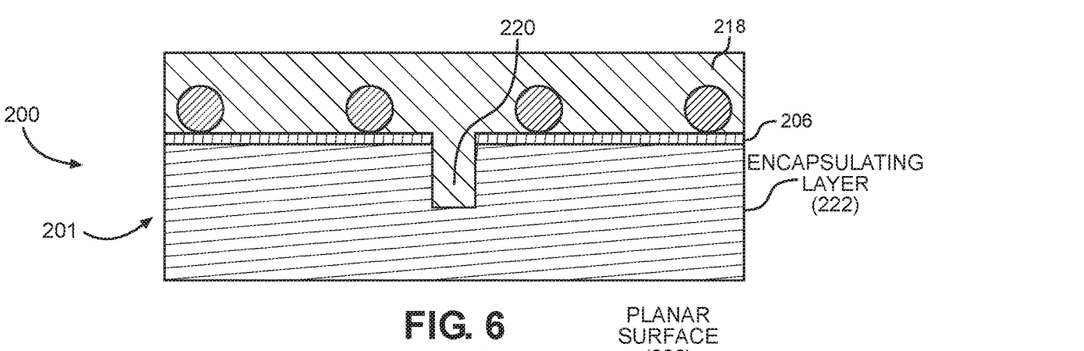
FIG. 6 is a cross-sectional side view of the substrate in FIGS. 5A and 5B in the process in FIG. 1 in which an encapsulating layer is formed on the back side of the substrate.

FIG. 6 is a cross-sectional side view of the substrate 200 in the process in FIG. 1, which includes forming an encapsulating layer 222 on the back side 201 of the substrate 200 and over the overmold rib 220 (block 108, FIG. 1). The encapsulating layer 222 in the example in FIG. 6 may be a molding compound material having high thermal conductivity. The encapsulating layer 222 may be formed by, for example, the high compression molding process for forming the overmold 218, as described above. The encapsulating layer 222 is formed to cover the back side 201 of the substrate 200 to a thickness sufficient to fully cover the overmold rib 220 of overmold 218 extending through the device layer 206.

Figure 7A:
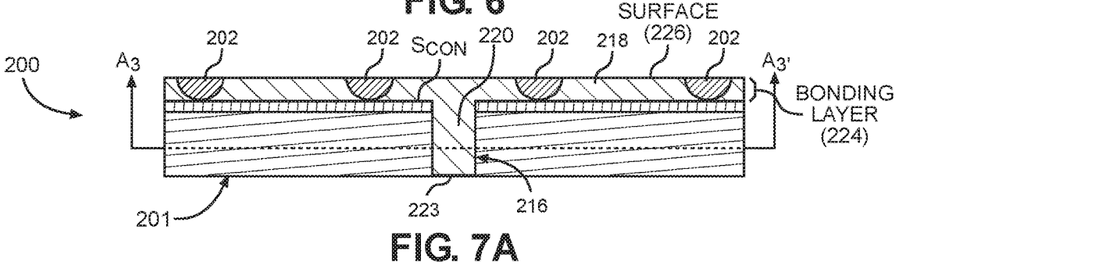
FIGS. 7A and 7B are a cross-sectional side view and a bottom view, respectively, of the substrate in FIG. 6 in the process in FIG. 1 in which the overmold is thinned to expose the bump structures and the encapsulating layer is thinned to expose the singulation guide.
Figure 7B:
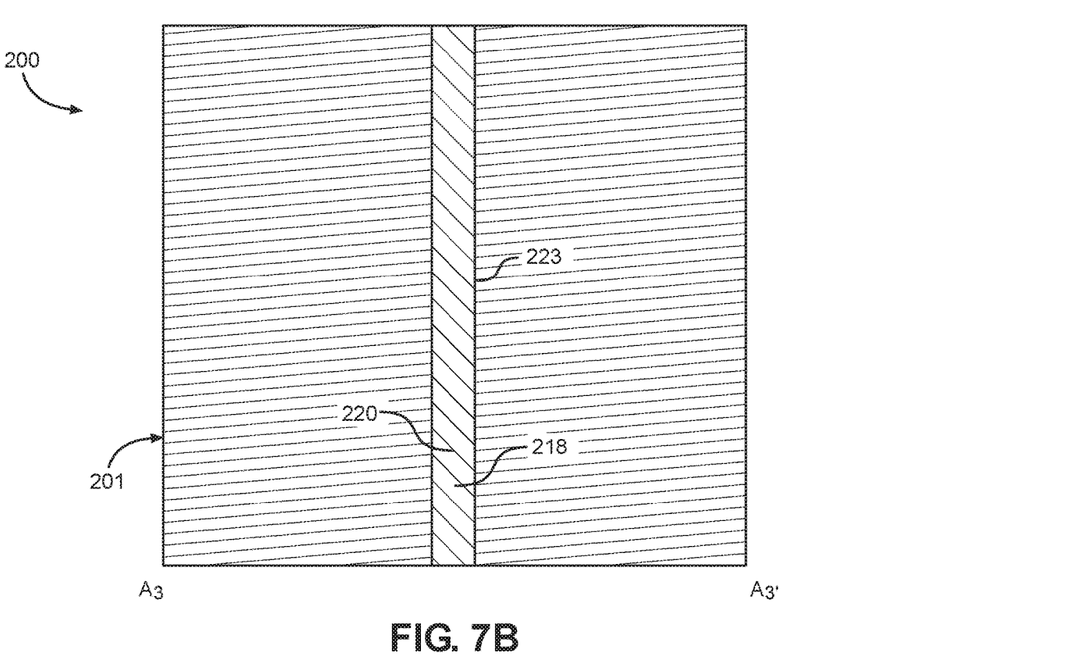

FIGS. 7A and 7B are a cross-sectional side view and a bottom view along line $A_3$-$A_3$' in FIG. 7A, respectively, of the substrate 200 in the process in FIG. 1, which includes thinning the encapsulating layer 222 on the back side 201 of the substrate 200 to expose a surface 223 of the overmold rib 220 formed of overmold 218 disposed in the channel 216 (block 110, FIG. 1). Thinning the encapsulating layer 222 may include, in one example, grinding the encapsulating layer 222 on the back side 201 of the substrate 200 to have a planar surface including the exposed surface 223 of the overmold rib 220 of the overmold 218, as shown in FIG. 7B. The process in FIG. 1 may also include thinning the overmold 218 on the contact surface $S_{CON}$ of the substrate 200 (e.g., by grinding) to expose the bump structures 202. The overmold 218 may be thinned to remove up to 50% or more of the bump structures 202, such that a bonding layer 224 including a planar surface 226 is formed. The bonding layer 224 includes the overmold 218 having a thickness equal to a thickness of the bump structures 202. The planar surface 226 includes each of the bump structures 202 and the overmold 218, and the planar surface 226 may be parallel to the contact surface $S_{CON}$.

Figure 8A:
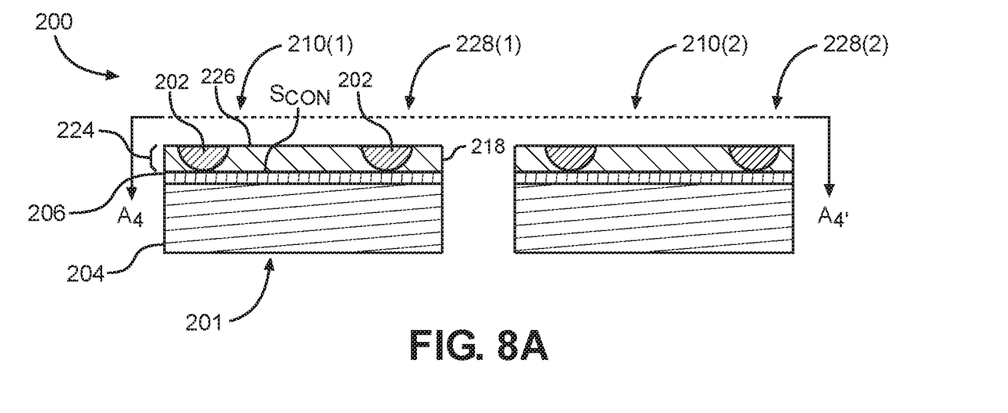
FIGS. 8A and 8B are a cross-sectional side view and a top view, respectively, in the process in FIG. 1 in which semiconductor dies are singulated from the thinned substrate in FIGS. 7A and 7B.
Figure 8B:
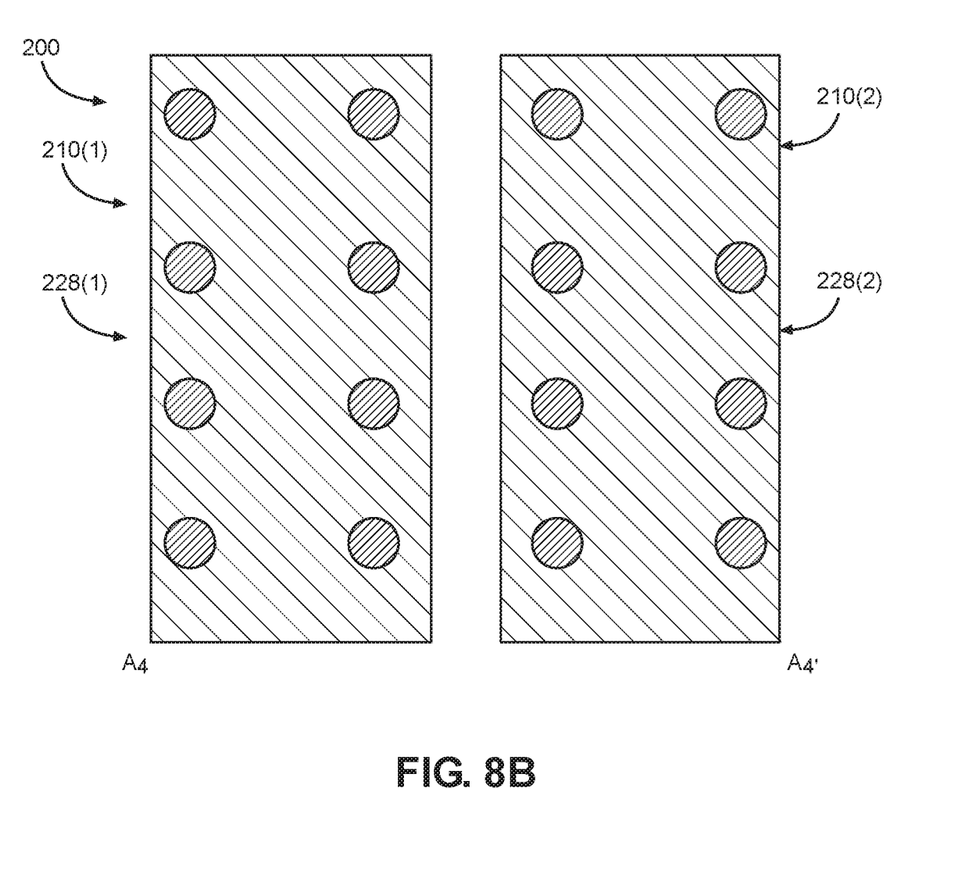

FIGS. 8A and 8B are a cross-sectional side view and a top view along line $A_4$-$A_4$' in FIG. 8A, respectively, of the substrate 200 in the process in FIG. 1, which includes singulating the substrate 200 to separate the first device 210(1) and the second device 210(2) guided by the exposed surface 223 of the overmold rib 220 (block 112, FIG. 1). The overmold rib 220 of overmold 218 provides a visible singulation guide on the back side 201 of the substrate 200 for singulation. Thus, semiconductor dies 228(1) and 228(2) are formed by singulating the devices 210(1) and 210(2) of the substrate 200. In the example shown, singulating the substrate 200 may include cutting the substrate 200 along the exposed surface 223 of the overmold rib 220 on the back side 201 of the substrate 200. The substrate 200 may be cut using a singulation saw, a laser, or other methods known to those skilled in the art. In this regard, a singulation problem caused by a heat mitigation feature, such as the overmold 218, obstructing visibility of a singulation guide on the contact surface $S_{CON}$ of the substrate 200 may be overcome by the process disclosed herein for forming a back side wafer singulation guide.

According to the process described in FIG. 1, the semiconductor dies 228(1) and 228(2) illustrated in FIG. 8B may be formed. The semiconductor die 228(1), for example, includes a device layer 206 including the first device 210(1) and the contact surface $S_{CON}$. The semiconductor die 228(1) also includes a thermally-conductive encapsulating layer 222 on a back side 201 of the device layer 206 opposite to the contact surface $S_{CON}$. The semiconductor die 228(1) includes a bonding layer 224 disposed on the contact surface $S_{CON}$, including bump structures 202 that are electrically coupled to the first device 210(1), an overmold 218 disposed on the contact surface $S_{CON}$ around the bump structures 202, and a planar surface 226 including a surface of each of the bump structures 202 and the overmold 218.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   forming a plurality of bump structures on a contact surface of a device layer of a substrate, the contact surface comprising a surface of the substrate;
   forming a channel through the contact surface and extending through the device layer into substrate material of the substrate;
   disposing an overmold on the contact surface and into the channel, the overmold disposed onto the substrate material of the substrate in the channel forming an overmold rib;
   removing the substrate material from a back side of the substrate to expose the overmold rib;
   forming an encapsulating layer on the back side of the substrate and over the overmold rib;
   thinning the encapsulating layer on the back side of the substrate to expose a surface of the overmold rib; and
   singulating the substrate by cutting along the surface of the overmold rib.

2. The method of claim 1, wherein forming the plurality of bump structures further comprises electrically coupling the plurality of bump structures to a device in the device layer.

3. The method of claim 1, wherein the substrate further comprises a wafer and forming the channel further comprises forming the channel to have a channel depth of approximately half (½) of a thickness of the wafer.

4. The method of claim 3, wherein the channel depth is in the range of 45% to 55% of the thickness of the wafer.

5. The method of claim 3, wherein the thickness of the wafer is approximately 725 micrometers (μm).

6. The method of claim 3, wherein the channel depth is in the range of approximately 325 μm to approximately 400 μm.

7. The method of claim 1, wherein forming the channel further comprises cutting the contact surface of the substrate with a saw.

8. The method of claim 1, wherein disposing the overmold comprises compression molding.

9. The method of claim 1, wherein removing the substrate material from the back side of the substrate further comprises etching the substrate material without etching the overmold.

10. The method of claim 9, wherein the substrate further comprises an etch stop layer between the device layer and the substrate material, and etching the substrate material comprises stopping the etching at the etch stop layer.

11. The method of claim 1, wherein forming the encapsulating material further comprises forming a thermally-conductive material.

12. The method of claim 1, wherein forming the encapsulating material further comprises compression molding.

13. The method of claim 1, wherein thinning the encapsulating layer further comprises grinding the encapsulating layer on the back side of the substrate.

14. The method of claim 1, wherein singulating the substrate further comprises cutting the substrate along the surface of the overmold rib.

15. The method of claim 1, further comprising:
   disposing the overmold to cover the plurality of bump structures on the contact surface; and
   thinning the overmold to expose the plurality of bump structures.

16. The method of claim 15, wherein thinning the overmold further comprises removing approximately 50% or more of each bump structure of the plurality of bump structures.

17. A semiconductor die, comprising:
   a device layer comprising a semiconductor device and a contact surface;
   a thermally-conductive encapsulating layer on a back side of the device layer opposite to the contact surface; and
   a bonding layer disposed on the contact surface, the bonding layer comprising:
      bump structures each electrically coupled to the semiconductor device;
      an overmold disposed on the contact surface around the bump structures; and a planar surface including each of the bump structures and the overmold.

18. The semiconductor die of claim 17, wherein the planar surface of the bonding layer is parallel to the contact surface.

19. The semiconductor die of claim 17, wherein a thickness of the overmold is equal to a thickness of each of the bump structures.

20. The semiconductor die of claim 17, wherein the bump structures are disposed in a ball grid array.

\* \* \* \* \*